US008189338B2

(12) United States Patent
Turner (10) Patent No.: US 8,189,338 B2
(45) Date of Patent: May 29, 2012

(54) POWER AMPLIFIER SYSTEM

(75) Inventor: Stephen D. Turner, State College, PA (US)

(73) Assignee: Paradise Datacom, LLC, State College, PA (US)

( * ) Notice: Subject to any disclaimer, the term of this patent is extended or adjusted under 35 U.S.C. 154(b) by 335 days.

(21) Appl. No.: 12/641,967

(22) Filed: Dec. 18, 2009

(65) Prior Publication Data

US 2011/0149525 A1    Jun. 23, 2011

(51) Int. Cl.
*H05K 5/00* (2006.01)
*H03F 3/68* (2006.01)

(52) U.S. Cl. .................................. 361/730; 330/124 R
(58) Field of Classification Search .............. 361/724, 361/727, 796, 679.02, 800, 816, 818, 756; 330/124, 124 D, 124 R, 126, 51; 370/347, 370/442, 458, 316, 221; 455/557, 428, 12, 455/427; 333/101, 136; 375/356, 373, 222
See application file for complete search history.

(56) References Cited

U.S. PATENT DOCUMENTS

| | | | |
|---|---|---|---|
| 5,280,625 A | 1/1994 | Howarter et al. | |
| 6,549,405 B2 | 4/2003 | Wharton et al. | |
| 6,842,348 B2* | 1/2005 | Lee | 361/796 |
| 6,879,627 B1 | 4/2005 | Davidson et al. | |
| 6,943,625 B2 | 9/2005 | Lane et al. | |
| 7,187,926 B1 | 3/2007 | Henkel | |
| 7,382,185 B1 | 6/2008 | Sternowski | |
| 7,463,707 B2 | 12/2008 | Dale et al. | |
| 7,525,396 B2 | 4/2009 | He et al. | |
| 7,598,461 B2* | 10/2009 | Kitamura et al. | 174/520 |
| 7,701,714 B2* | 4/2010 | Shabany | 361/698 |
| 7,719,848 B2* | 5/2010 | Widmayer et al. | 361/752 |
| 7,733,658 B1* | 6/2010 | Perkins et al. | 361/752 |
| 2004/0228090 A1* | 11/2004 | Blackwell | 361/695 |
| 2005/0152301 A1 | 7/2005 | Bettinger et al. | |
| 2006/0270451 A1 | 11/2006 | Best et al. | |
| 2007/0019605 A1 | 1/2007 | Rioux et al. | |
| 2007/0139104 A1 | 6/2007 | Yuan | |

* cited by examiner

*Primary Examiner* — Lisa Lea Edmonds
*Assistant Examiner* — Xanthia C Cunningham
(74) *Attorney, Agent, or Firm* — McNees Wallace & Nurick LLC (57) ABSTRACT

A modular power amplifier system includes power amplifier modules removably mounted within a cabinet. Each of the power amplifier modules includes an embedded controller and a power amplifier. An RF distribution panel includes an input port for receiving an RF input signal, and a signal splitter for dividing the RF input signal for input to the plurality of power amplifier modules. Coaxial dividers are configured to divide the RF input signal substantially equally between the plurality of power amplifier modules. Passive waveguide combiners are configured to combine the amplified RF output signals from the plurality of power amplifier modules at an output port to provide an RF output signal. A designated master controller monitors operating parameters associated with each power amplifier module. The combined power rating of the power amplifier modules exceeds a rated power of the system by at least one power amplifier module.

22 Claims, 10 Drawing Sheets

POWER AMPLIFIER SYSTEM

CROSS-REFERENCE TO RELATED PATENT APPLICATIONS

The subject matter of this application is related to U.S. patent application Ser. No. 12/642,160 filed on even date herewith, and entitled "POWER AMPLIFIER CHASSIS"; the disclosure of which is hereby incorporated by reference.

BACKGROUND

The application generally relates to a power amplifier system. The application relates more specifically to a modular power amplifier system with fault tolerant redundancy.

Currently, a power amplifier system may be designed to have little or no excess capacity or duplicated components for fail-safe protection, also referred to as redundancy. Other power amplifier system designs may include a single-chassis redundancy, while still other designs may include multiple, or "n"-chassis which incorporate a degree of unswitched, n+1 redundancy and are controlled by a single controller.

A single amplifier chassis with no redundancy may be used to implement a redundant power amplification system. Such a system provides limited options for performing routing field maintenance or repairs, and must be used with a switch to provide one-to-one, or one-to-two amplifier configurations. The switch in a redundant single-amplifier chassis system is an additional active device that may potentially fail. Also, the single amplifier chassis system must be interrupted during switch engagement. The output power of a single amplifier chassis system is limited to what can be achieved in a single chassis.

In a power amplifier system with a combined chassis or single-chassis redundancy system, two power amplifiers, each of which is capable of driving the full output load, are configured in parallel operation. The combination of the parallel amplifiers have double the output power capability of a single chassis amplifier, although only half of the total output power capability is used at any one time. The single chassis redundancy option does not provide n+1 redundancy, and may include several potential points of failure, e.g., switches, embedded controllers, etc.

In a single amplifier chassis with multiple modules, e.g., an 8-amplifier module, some redundancy may be realized. A slightly higher power level is available in traditional single chassis amplifiers. Single chassis with eight individual amplifier modules provides the amplifier with a limited degree of n+1 redundancy that is switchless. The failure of (1) out of (8) modules results in a loss of 1.5 dB of output power so the system can be used as a "self-contained" redundant system. However, a traditional single chassis amplifier includes just a single embedded controller that may potentially be a point of failure.

SUMMARY

One embodiment relates to a modular power amplifier system. The modular power amplifier system includes a cabinet. Power amplifier modules are removably mounted within the cabinet. Each of the power amplifier modules includes an embedded controller and a power amplifier, and an RF distribution panel. The RF distribution panel includes an input port for receiving an RF input signal, and a signal splitter for dividing the RF input signal for input to the plurality of power amplifier modules. A plurality of coaxial dividers is configured to divide the RF input signal substantially equally among the plurality of power amplifier modules. Passive waveguide combiners are configured to combine the amplified RF output signals from the plurality of power amplifier modules at an output port to provide an RF output signal. One embedded controller is designated as a master controller. The master controller monitors operating parameters associated with each power amplifier module. The master controller is further configured to transfer master control to another embedded controller selected from one of the remaining embedded controllers in response to the embedded controller sensing that one or more operating parameters indicates a failure of the master controller. The combined power rating of the plurality of power amplifier modules exceeds a rated power of the system by at least one power amplifier module.

Certain advantages of the embodiments described herein are embedded control within each power amplifier module for complete parallel redundancy of the monitor and control functions, and a multiple chassis cabinet that allows a higher-power amplifier module to be integrated into chassis.

Alternative exemplary embodiments relate to other features and combinations of features as may be generally recited in the claims.

DETAILED DESCRIPTION OF THE EXEMPLARY EMBODIMENTS

A modular power amplifier system 10 (FIG. 1) disclosed herein may be employed in communication systems, in particular satellite communications system, to provide a large degree of output power redundancy and field maintainability which are lacking in traditional amplifier systems. In one aspect the redundancy is achieved through the parallel system microwave power combining RF (Radio Frequency) output power from the modular power amplifier system 10 is achieved at a high level that is provided through multiple power components operating at a lower power level. The lower power component is a single amplifier module or chassis. As disclosed in greater detail below, the failure of one amplifier of the multiple component system results in a lesser degree of total output power reduction, allowing the system to continue in operation at a lower output power level without interruption. This capacity increase is referred to as n+1 redundancy.

Figure 1:
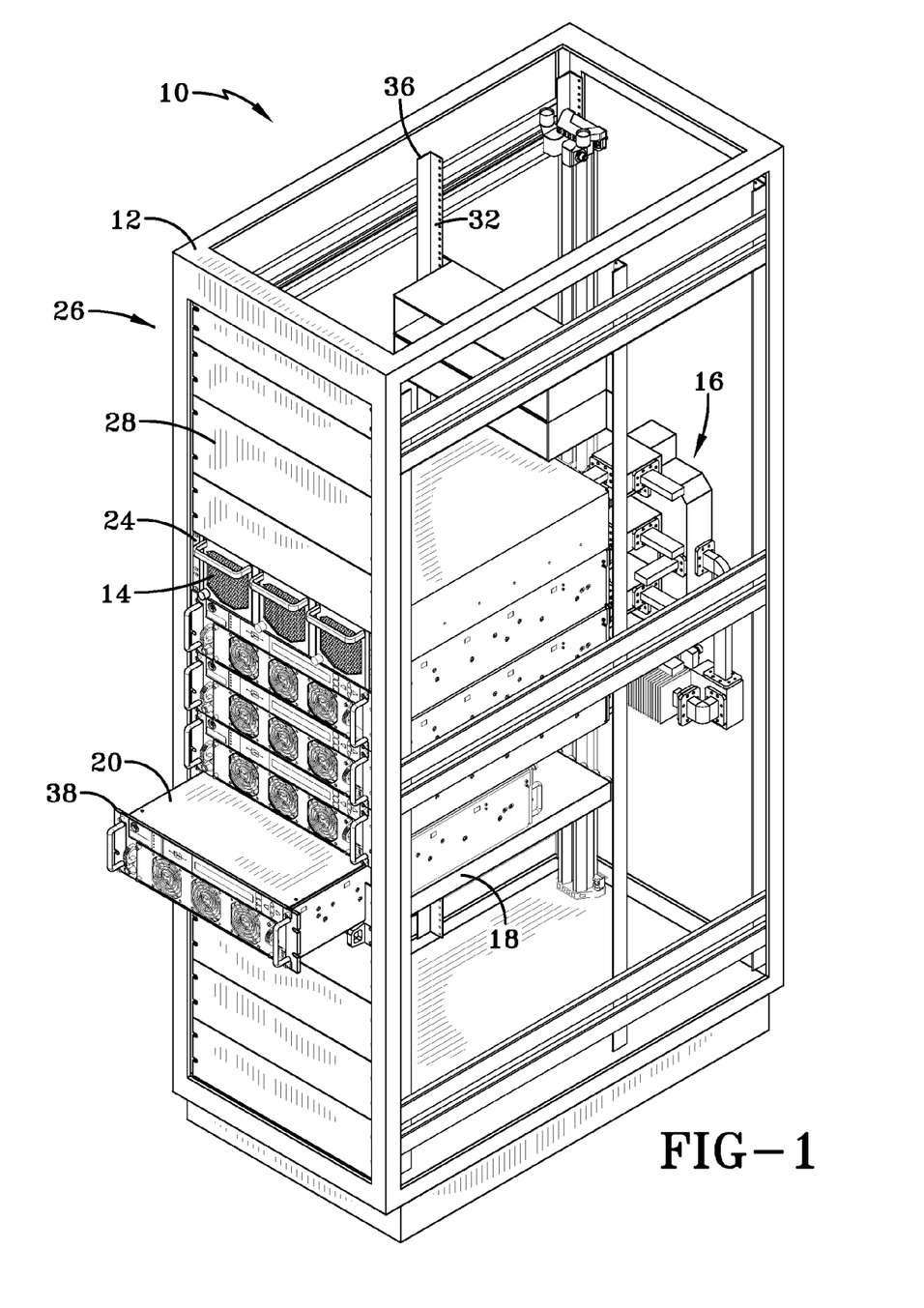
FIG. 1 illustrates a front perspective view of an exemplary modular power amplifier system having four amplifier chassis mounted thereon.
Figure 2:
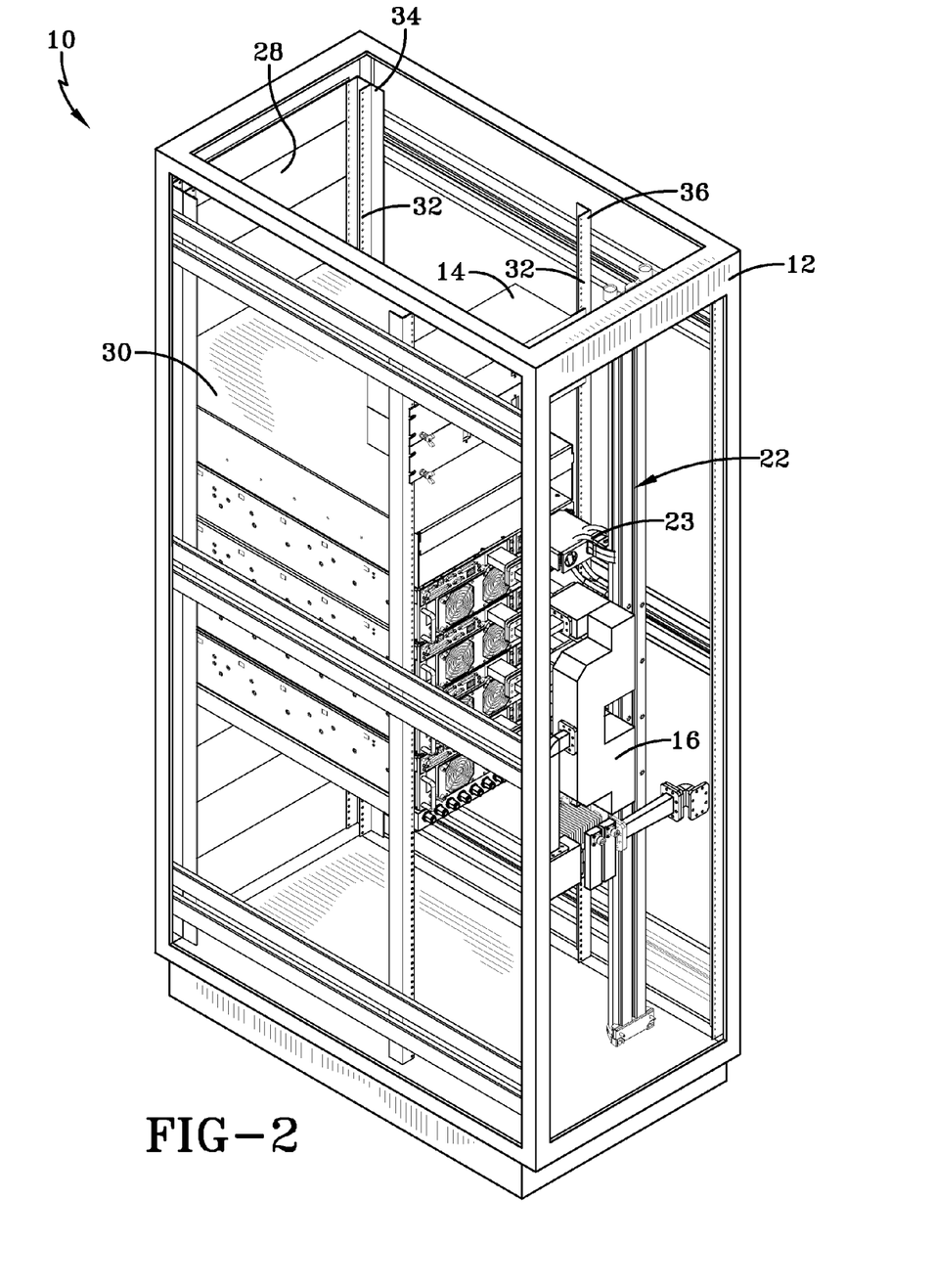
FIG. 2 illustrates a rear perspective view of the modular power amplifier system of FIG. 1.

Referring to FIGS. 1 and 2, one embodiment of a modular power amplifier system 10 includes a cabinet 12 capable of accommodating up to eight power amplifier chassis 20, an RF distribution panel 18, a waveguide combiner 16, and a redundant power supply 14. In the exemplary embodiment shown in FIGS. 1 and 2, only four power amplifier chassis 20 are installed in cabinet 12. Cabinet 12 may be arranged with any number of power amplifier chassis 20 between two and eight. In alternate embodiments, an individual cabinet 12 may be designed to accept a maximum of more or less than eight power amplifier chassis 20, depending on the application. In another exemplary embodiment (shown in FIGS. 3 and 4), two cabinets 12 may be coupled through a waveguide combiner 16 to bring the capacity of a modular power amplifier system 10 up to sixteen (2×8) power amplifier chassis 20. Each power amplifier chassis 20 includes a solid state power amplifier (SSPA) module 100 (FIG. 9) as a sub-unit of chassis 20. The terms power amplifier chassis 20 and SSPA module 100 may be used interchangeably in this specification.

Cabinet 12 includes a power rail assembly 22 extending vertically adjacent the rear of cabinet 12. Power rail assembly 22 is preferably insulated includes longitudinal slots in the insulating layer (not shown) for receiving terminals of power cables 23 into electrical contact with the internal power conductors of power rail assembly 22. Power cables 23 connect internal power busses (see, e.g., FIG. 9) in the power amplifier chassis 20 to power rail assembly 22.

The RF distribution panel 18 receives an RF input signal (FIG. 9) from a signal source, e.g., a satellite modem (not shown) and divides the RF input signal two ways for distribution to power amplifier modules 20. For a configuration of four power amplifier modules, RF inputs are divided into two input paths, which are then further split into two more input paths to divide the original RF input signal from the signal source into four approximately equal RF amplifier input signals. The four power amplifier modules 20 process the RF input signals, and the processed RF signals are combined in the reverse manner as described above by the waveguide combiner 16 to provide RF output at a very high level from a plurality of lower power level components. In modular power amplifier system 10, power is combined passively, i.e., no switching is used, thus the RF output power is never interrupted due to a failure of a switching device. Modular power amplifier system 10 may be employed as a "self-redundant" system. The output power is sized such that the loss of a single power amplifier chassis 20 will allow the system to maintain its minimum required output power. This type of system architecture is described as n+1 redundant. System 10 may be configured with any number of parallel power amplifier modules 20. Preferably system 10 may include binary combinations of 4, 8, or 16 modules. A more detailed discussion of the waveguide combiner 16 and amplifier operation is set forth below.

Each power amplifier chassis 20 mounts in cabinet 12 through a front access panel 26. Front access panel 26 includes a plurality of separately removable cover plates 28. Each power amplifier chassis 20 is slidably insertable and removable in a slot by removing one or more of the cover plates 28. For vertical alignment of power amplifier chassis 20, side rails 30 mate with teeth 32 in forward and rear vertical rails 34, 36, respectively, of cabinet 12. Power amplifier chassis 20 also includes flange portions 38 on either side of front panel 58 (see FIG. 6), for fastening power amplifier chassis 20 to cabinet 12.

Each power amplifier chassis 20 includes an embedded controller or microprocessor 101 (FIG. 9) for complete parallel redundancy of the monitor and control functions. If a failure occurs within an amplifier chassis 20, the next amplifier chassis 20 in the system hierarchy will assume control as the "master" controller. The transfer of control is accomplished by the communication/alarm bus 150. (see FIG. 9) Therefore remote control as well as local control is maintained without interruption.

Figure 9:
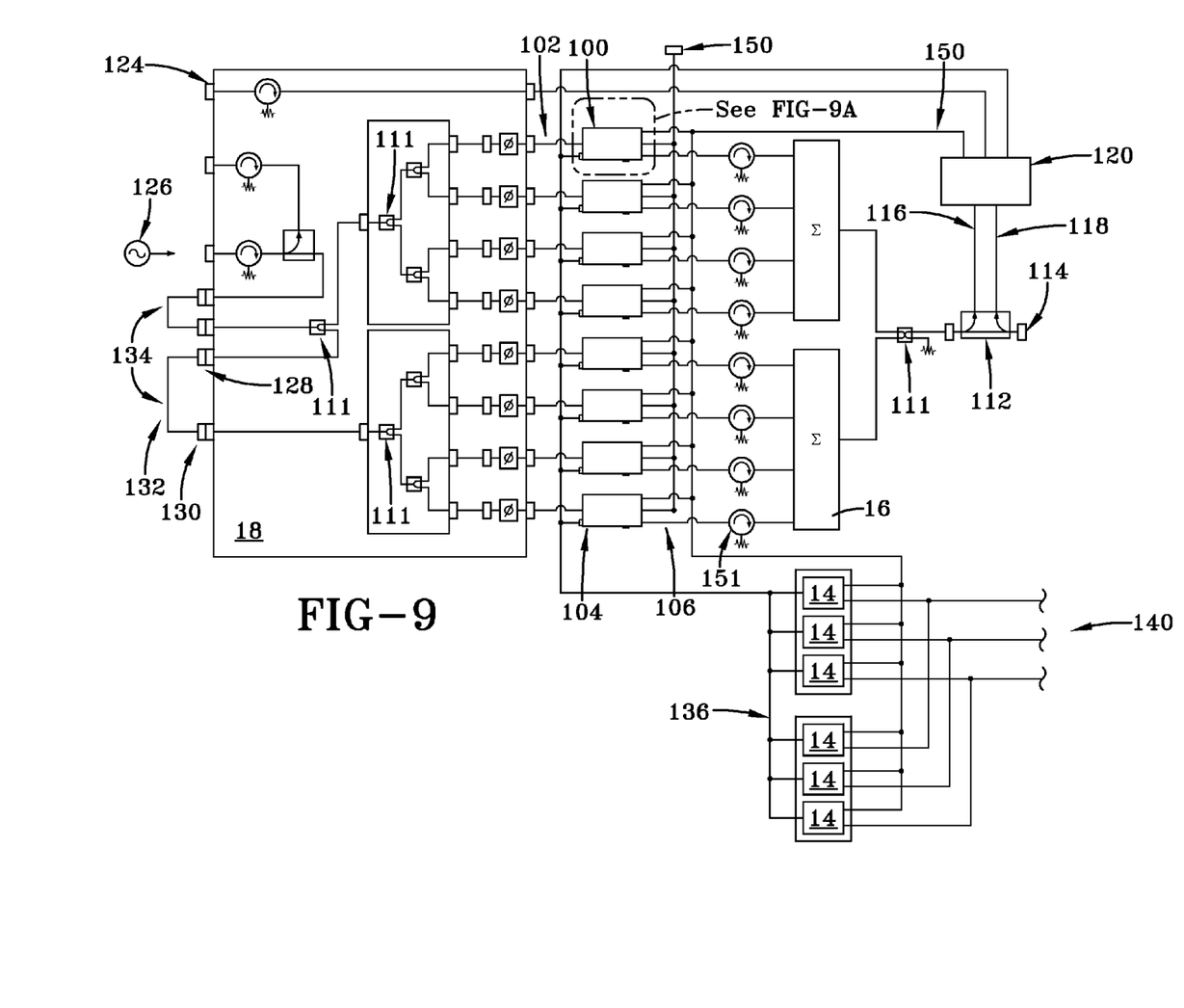
FIG. 9 is a schematic block diagram of an exemplary solid state power amplifier.
Figure 9A:
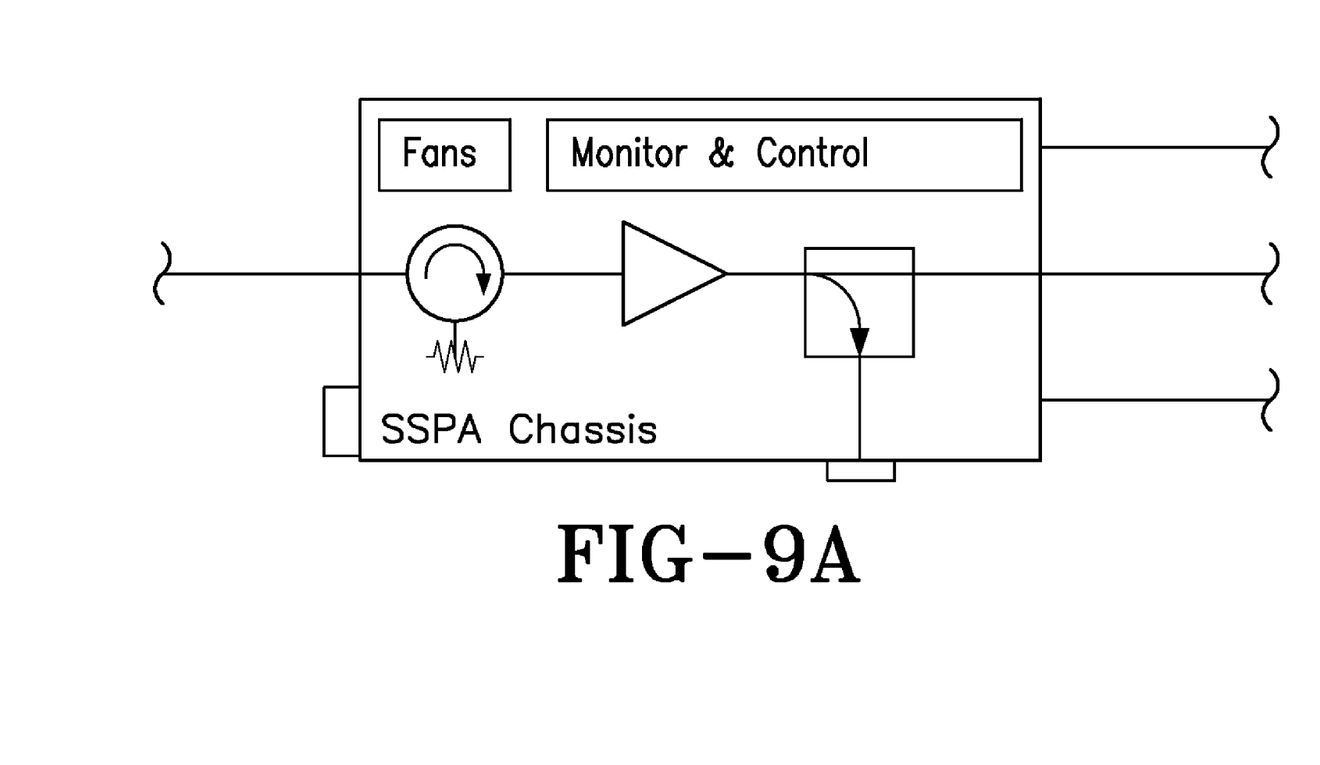
FIG. 9A shows a schematic diagram of an SSPA chassis.

Further, multiple chassis 20 allow a higher power amplifier 110 (FIG. 9) to be integrated into chassis 20. An individual amplifier chassis 20 has greater power density as well as physical space for air cooling components contained within amplifier chassis 20, than a single chassis device with multiple amplifiers (FIG. 9). For example, the present output power limitation of a single chassis amplifier at C Band may be 1500 watts (W) because all of the power amplifiers reside within the confined volume of a single chassis. By contrast, the modular power amplifier system 10 having multiple chassis, e.g., two to sixteen modules, is capable of power levels in excess of 5000 W because each chassis or chassis 20 houses a single power amplifier 110 (FIG. 9). In addition, the use of multiple Power amplifier modules 20 allows a user to incrementally scale the deployment of system 10. I.e., the user may begin with two amplifier chassis 20 mounted in cabinet 12, and at a later time or times increase system 10 capacity to four, eight or sixteen chassis 20. External waveguide combiner hardware is external to chassis 20, which allows the waveguide combiner components to be field modified by the user.

RF distribution panel 18 provides splitters 111 (see FIG. 9) for dividing a main RF input signal 126 (FIG. 9) equally into low power signal components and distributing the low power signals to each of the power amplifier chassis 20 inputs. System 10 can include any integer number of amplifier chassis 20 between two and sixteen. An embedded microprocessor 101 in each of the power amplifier chassis 20 includes logic controls configured to automatically assign one of the amplifier chassis 20 to assume the role of a master controller, with the remaining power amplifier chassis 20 being slave devices. Each of the amplifier chassis 20 includes a light emitting diode (LED). The LED on the amplifier chassis 20 that is functioning as the master controller power amplifier chassis 20 will be illuminated to identify which of the amplifier chassis 20 is currently operating as the master controller. On the front panel 58 of each power amplifier chassis 20 a liquid crystal display (LCD) 46 will also clearly identify the master controller. The distributed controller arrangement allows system 10 to operate the array of amplifier chassis 20 as a single amplifier chassis. Each of the embedded microprocessors 101 includes logic for transferring control of system 10 to another amplifier chassis 20 if the master amplifier chassis 20 fails.

Figure 3:
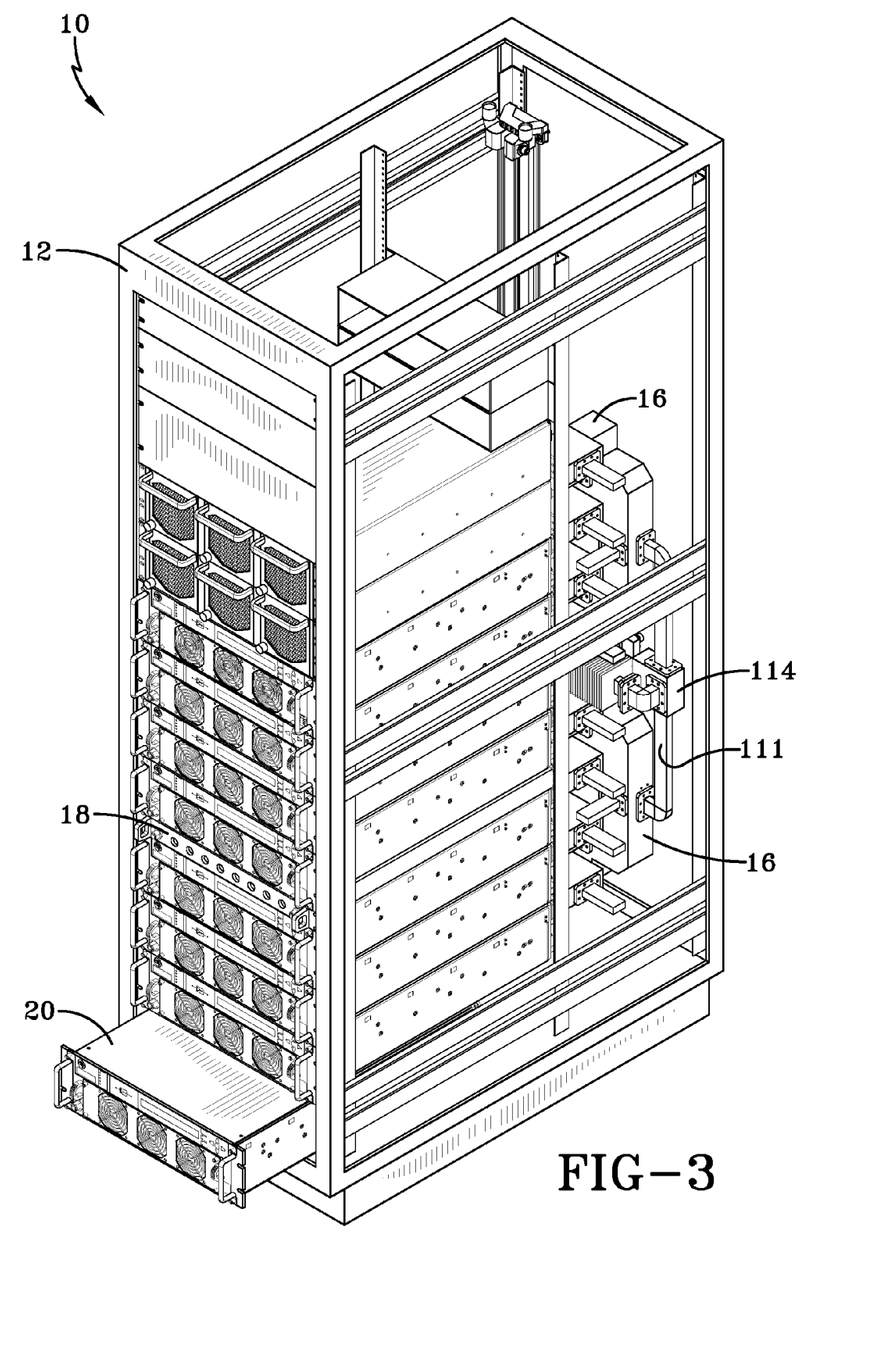
FIG. 3 illustrates a front perspective view of an exemplary modular power amplifier system having eight amplifier chassis mounted thereon.
Figure 4:
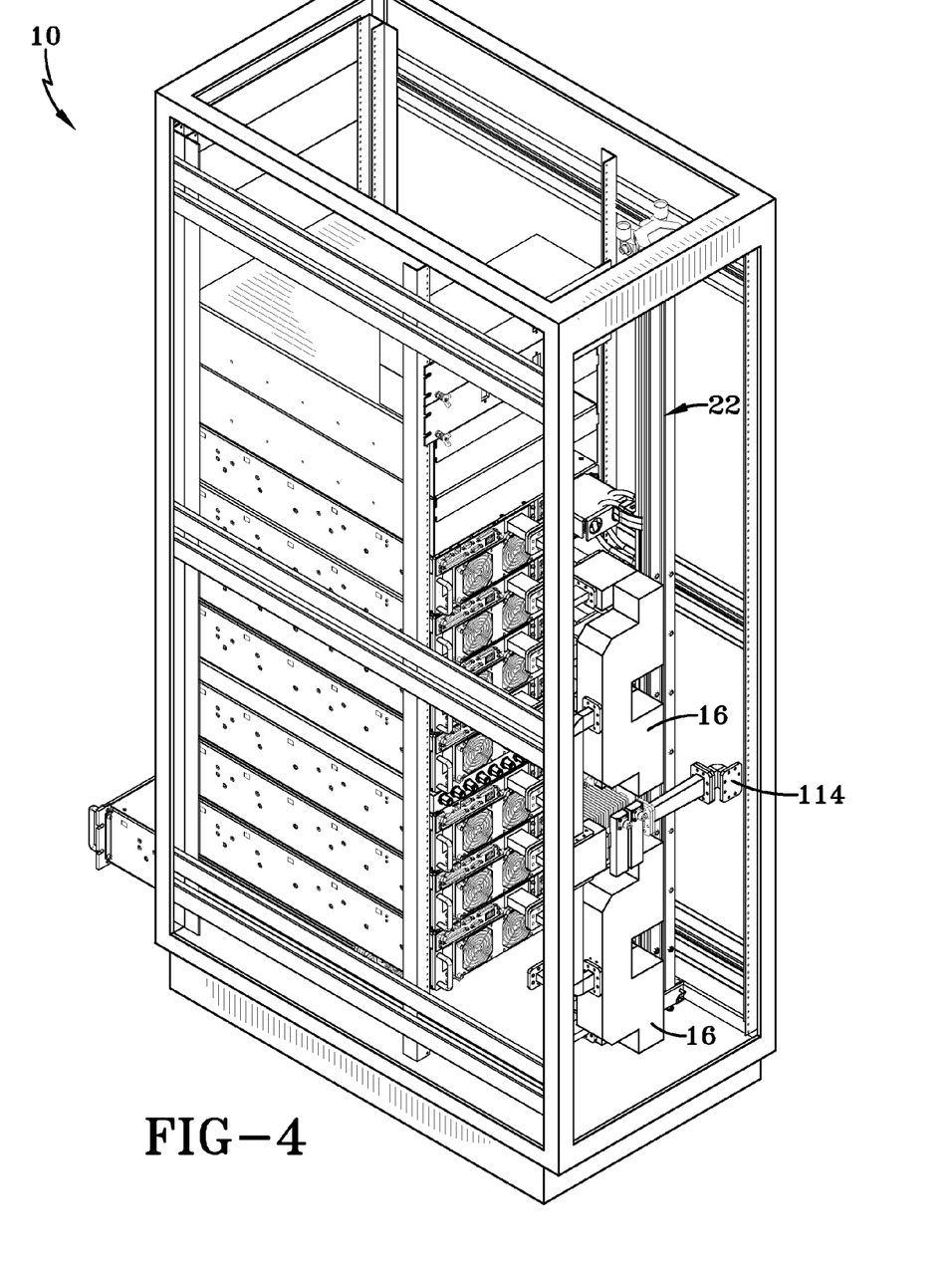
FIG. 4 illustrates a rear perspective view of the modular power amplifier system of FIG. 3.

Referring to FIGS. 3 and 4, an exemplary modular power amplifier system 12 has eight amplifier chassis 20 mounted in cabinet 12. FIG. 4 illustrates a rear perspective view of the eight-amplifier modular power amplifier system 10. A pair of 4-way waveguide combiners 16 are connected with a 2-way waveguide combiner 111 such that a set of eight amplifiers chassis are combined into a single RF output port 114.

Each of embedded microprocessors or controllers 101 may be configured to monitor multiple parameters of power amplifier chassis 20 that are indicative of an amplifier failure, e.g., internal temperatures, power and current inputs and outputs, unbalanced loads, etc. In response to a failure indication, embedded microprocessor 101 transfers master control of system 10 to one of the remaining power amplifier chassis 20 and clears itself from system 10. Master control may be transferred to the adjacent power amplifier chassis 20 in the system. Alternately, any of the remaining power amplifier chassis 20 may be designated master controller, e.g., according to a numerical sequence, randomly, etc. Once the control is transferred to a second power amplifier chassis 20, the newly designated master control power amplifier chassis 20 remains the master controller until the failed power amplifier chassis 20 has been repaired or replaced, or until a failure indicator requires a transfer to a third power amplifier chassis 20 or in the case of a two-module system 10, a transfer back to the first power amplifier chassis 20.

When a failure/alarm condition occurs within a given SSPA chassis, the system will initiate a minor alarm condition. The minor alarm condition is reported both locally, on the front panel of the Master SSPA Chassis, as well as remotely via the Ethernet interface. The minor alarm condition does not impair system operation just simply notifies the user that a fault has occurred in that give SSPA chassis.

An embedded controller 101 in each SSPA amplifier module 100 monitors all functions of the n+1 redundant system via communication/alarm bus 150 (see FIG. 9). Communication/alarm bus 150 allows the remaining controllers to adjust the gain level of the remaining amplifier modules 20 to keep the overall system gain equal to the system gain when all eight SSPA modules 100 are active. This portion of the system fault tolerance equalizes the system gain in the presence of a failure therefore causing no system level changes to the satellite modem or frequency converters that are feeding a signal into the amplifier system 10.

Embedded controller 101 monitors overall system output power from power measurement module 120. System output power and reflected power are monitored by the embedded controller network and displayed on front panel 42 of the master amplifier chassis 20 and by remote control, e.g., via an Ethernet port. The flexibility of embedded controller 101 is such that any amplifier chassis 20 may be removed from cabinet 12 and used as a stand-alone amplifier chassis 20.

Each power amplifier chassis 20 may be disengaged during operation of system 10, i.e., while "hot", repaired and/or replaced with another or a repaired power amplifier chassis 20. Since system 10 is sized with n+1 power amplifier modules 20, the loss of a single power amplifier chassis 20 from system 10 does not impact performance. Additional power amplifier chassis 20 may be disengaged from system 10 during operation, which may result in a decrease in performance of system 10.

Figure 5:
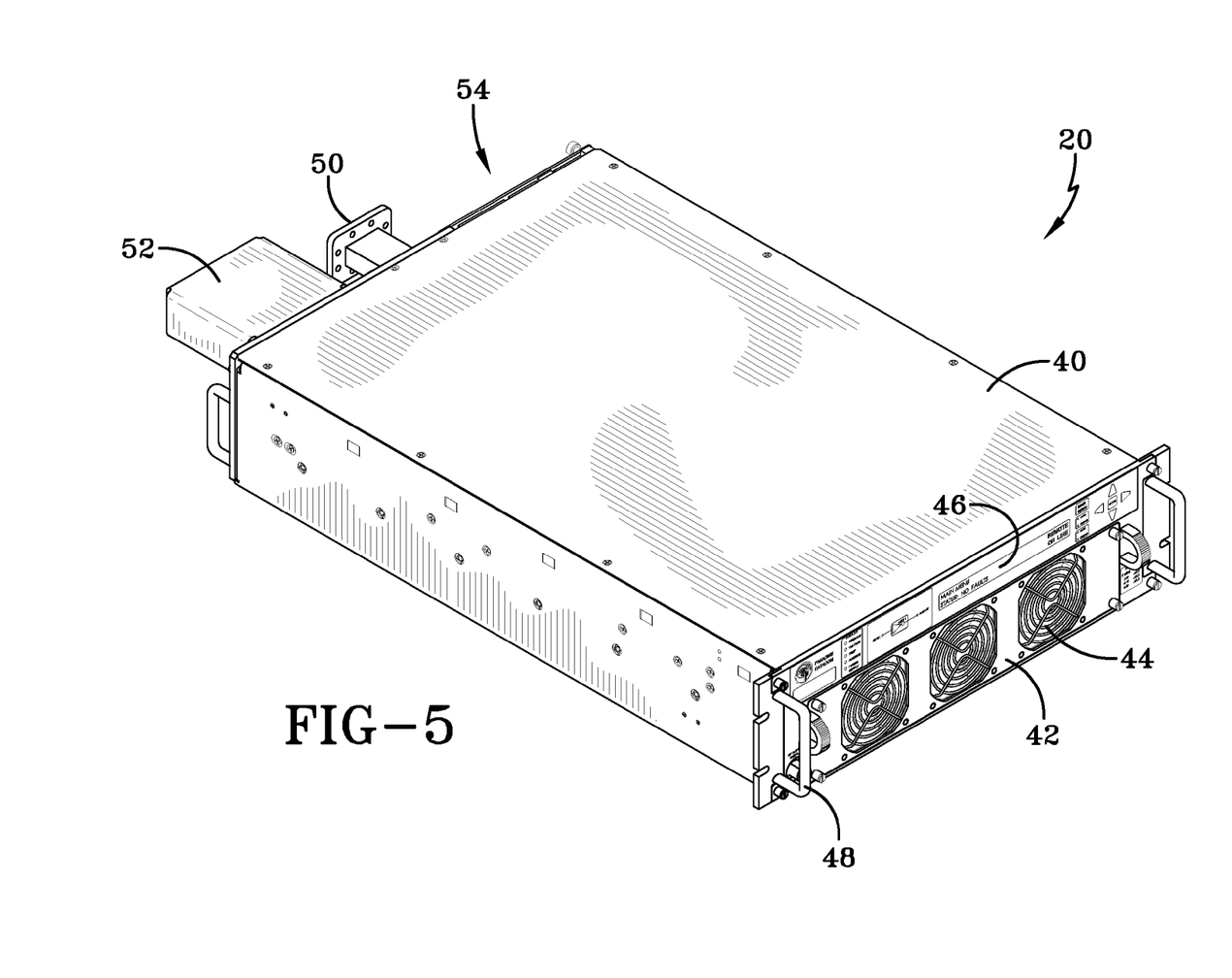
FIG. 5 illustrates a front perspective view of an exemplary solid state power amplifier chassis.

Referring to FIG. 5, a power amplifier chassis 20 includes a rectangular enclosure 40 which houses and supports the internal electronic components. A removable front panel module 42 includes fans 44 for drawing air through enclosure 40, an LED display 46 to provide, e.g., indicators of the operational status of power amplifier chassis 20, and miscellaneous hardware for removably attaching panel module 42 to enclosure 40. A pair of brackets 48 are attached to enclosure 40 at opposite sides of front panel module 42, to facilitate the removal of power amplifier chassis 20 from cabinet 12. At rear panel 54 of power amplifier chassis 20, a waveguide coupler 50 interconnects with an interface between the output of each individual power amplifier chassis 20 and waveguide combiner 16. A DC power connector 52 is also mounted on removable rear panel 54 for connecting power amplifier chassis 20 to power rail assembly 22.

Figure 6:
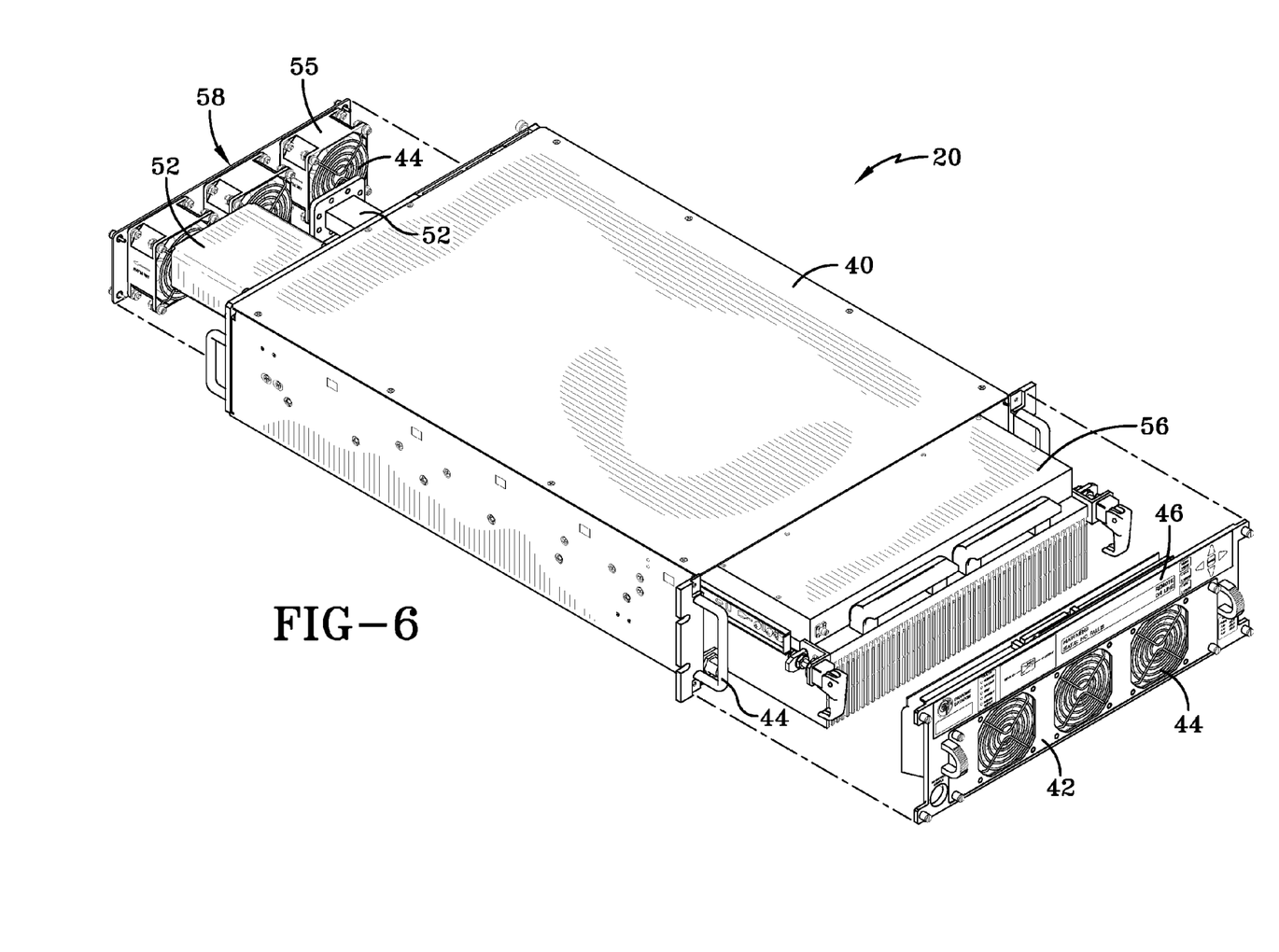
FIG. 6 illustrates an exploded view of the solid state power amplifier chassis of FIG. 5, and removable amplifiers module and fans.

Referring to FIG. 6, all subassemblies containing active components are removable from the SSPA chassis from the front panel. Active components are defined by components that consume electrical current and can be subject to wear-out and failure. The alarm circuitry within the system will notify the operator to which subassembly has faulted. These subassemblies include Front Panel Fan 44 and Fan Tray 42, Front Panel Display 46, SSPA Module 56, Rear Panel Fan 56 and Fan Tray 58, Rear Panel Embedded Controller (M & C) Card 52, and Power Supply Module 14. The system does not require to be powered off during replacement of any of the above subassemblies. The system will continue to operate normally while removing and replacing any of the above subassemblies. After replacement of any of the subassemblies and the SSPA chassis comes back online, the faulted SSPA chassis will automatically clear its previous fault condition and remove the minor alarm status report.

Figure 7:
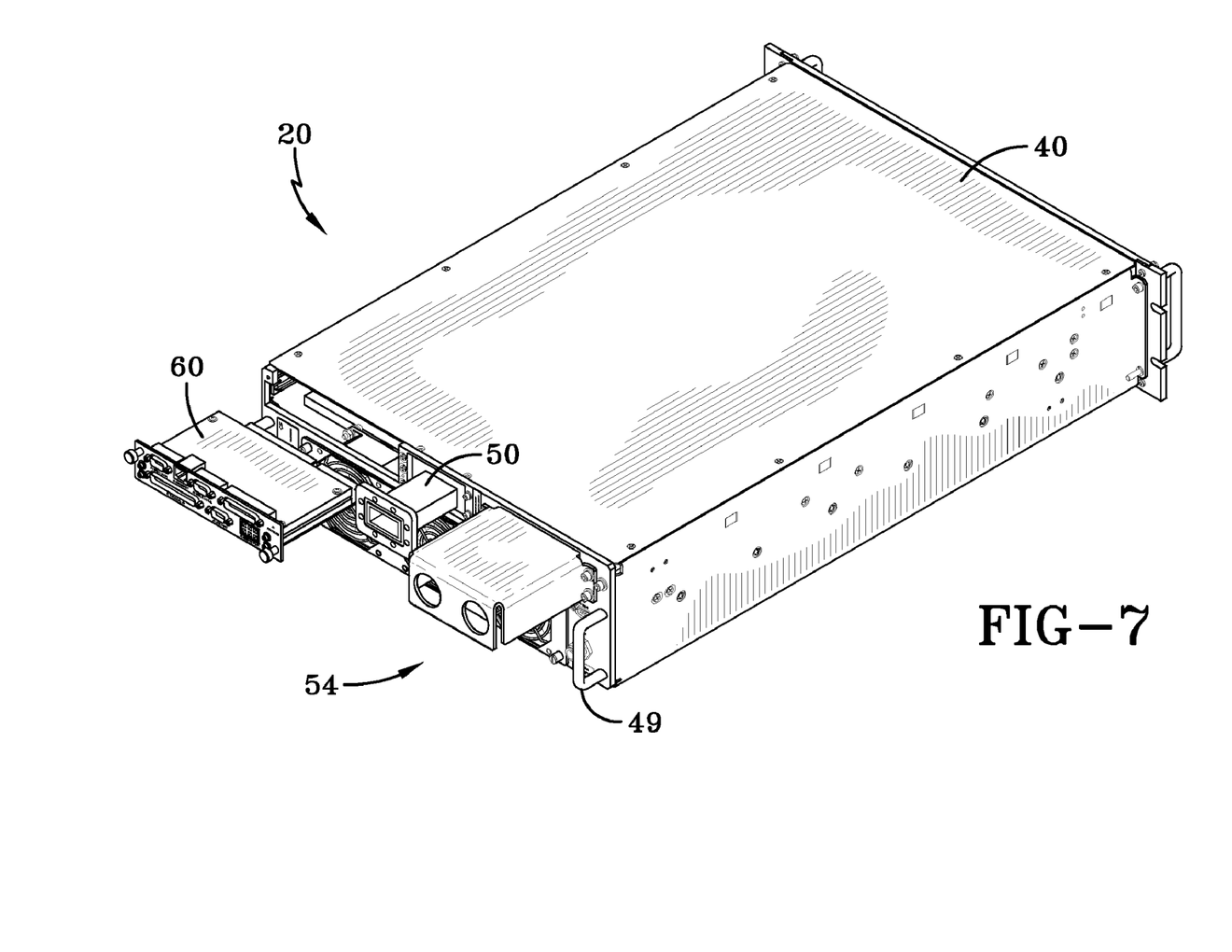
FIG. 7 illustrates a rear perspective view of the solid state power amplifier chassis and removable controller module.

Further referring next to FIG. 6, an exploded view of power amplifier chassis 20 shows a solid state power amplifier (SSPA)/heatsink module 56 partially removed from housing 40. Front panel module 42 and rear fan module 55 are removable for maintenance and replacement of fans 44, and for accessing SSPA/heatsink module 56. Front and rear panel modules 42, 55 also retain SSPA/heatsink module 56 within enclosure 40 when attached thereto. A rear perspective view of power amplifier chassis 20 in FIG. 7 illustrates a removable I/O module 60 containing a control interface for connecting power amplifier chassis 20 to RF distribution panel 18. A rear bracket 49 is also provided for gripping enclosure 40.

Figure 8:
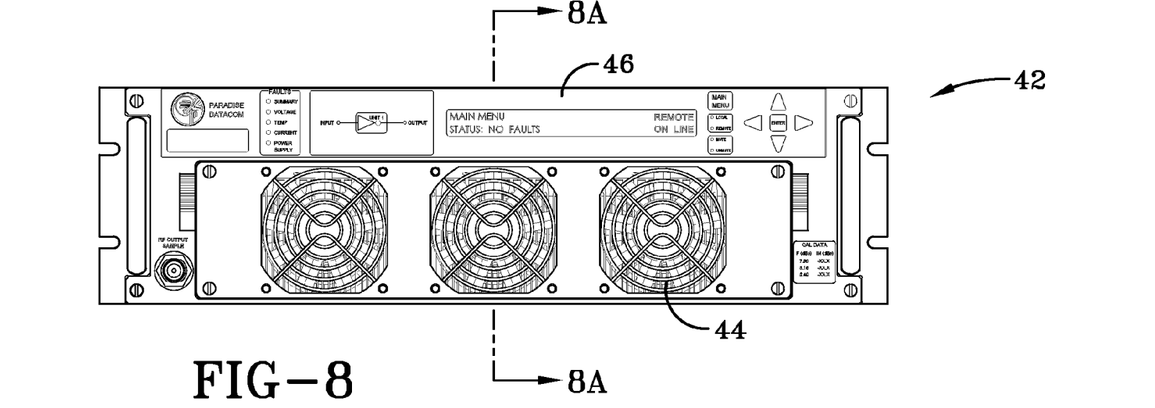
FIG. 8 illustrates an elevational front view of the solid state power amplifier chassis.
Figure 8A:
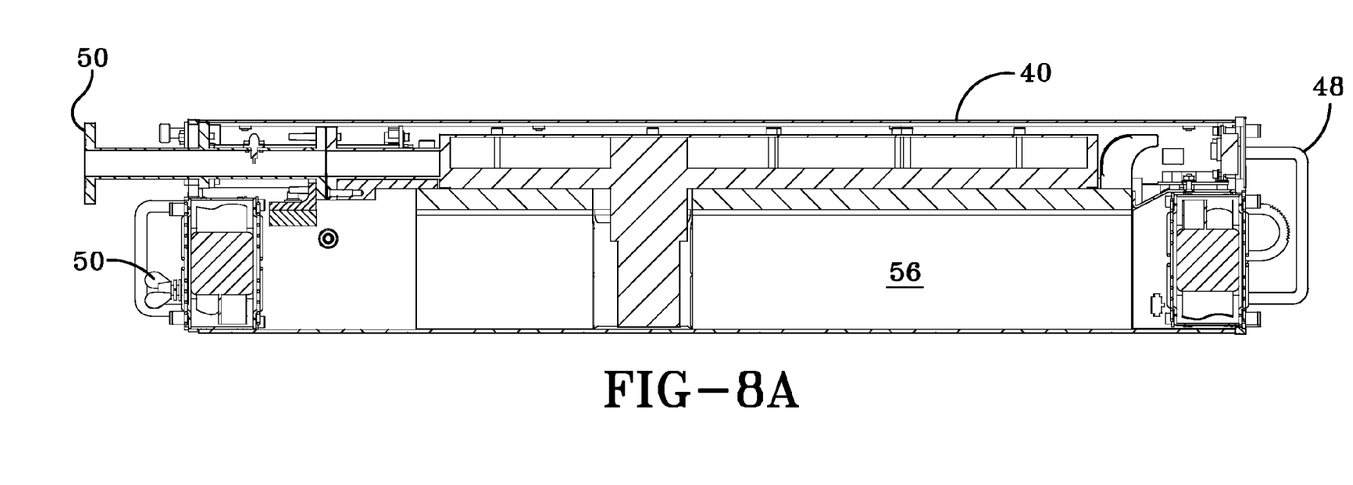
FIG. 8A illustrates a sectional view of the solid state power amplifier chassis taken along the lines 8A-8A in FIG. 9.

FIG. 8 shows LED display 46 and fans 44 mounted in front panel module 42. FIG. 8A is a cross-sectional view of power amplifier chassis 20 taken along the lines 8A-8A in FIG. 8. Waveguide section 50 is shown projecting rearward for attachment to waveguide combiner 16, and front and rear brackets 48, 49 for inserting and extracting enclosure 40 and SSPA/heatsink 56 to or from cabinet 12.

Referring to FIG. 6, all subassemblies containing active components are removable from the SSPA chassis from the front panel. Active components are defined by components that consume electrical current and can be subject to wear-out and failure. The alarm circuitry within the system will notify the operator to which subassembly has faulted. These subassemblies include Front Panel Fan 44 and Fan module 42, Front Panel Display 46, SSPA Module 56, Rear Panel Fan 56 and Fan Tray 58, Rear Panel Embedded Controller (M & C) Card 52, and Power Supply Module 14. The system does not require to be powered off during replacement of any of the above subassemblies. The system will continue to operate normally while removing and replacing any of the above subassemblies. After replacement of any of the subassemblies and the SSPA chassis comes back online, the faulted SSPA chassis will automatically clear its previous fault condition and remove the minor alarm status report.

A directional waveguide coupler 112 is connected between the output of 2-way waveguide combiner 111 and RF output port 114. Directional waveguide coupler 112 provides reverse RF power 116 and forward RF power 118 samples to an RMS power measurement module 120. A forward power sample is created in RMS power measurement module 120 attached to the front panel 124 of the RF distribution box 18. RMS power measurement module 120 provides accurate measurement of the system RF output power. This RF output power reading is displayed on the master chassis display 46 and reported on the communication/alarm bus 150.

On the input side of system 10, an RF input signal is divided approximately evenly in the reverse configuration as described above with respect to the waveguide combiners 16, 111. In the RF distribution panel 18, a main RF input 126 is coupled with an eight way RF input 128 or four way RF input port 130, depending on the configuration or number of power amplifier modules 100. From there the main RF input signal 126 is split in binary fashion into four or eight inputs, i.e., an input 102 for each SSPA module 100. Splitters 111 function the same as combiners 16, 111, and are designated separately herein to differentiate splitters 111 from combiners 16, 111 in system 10 architecture. In practice, each device is equivalent, the only difference being the power level of splitters 111 are less than the power level of combiners 16, 111, and their placement in the system with respect to the processing of input and/or output signals. System links 132 134 are provided for converting system 10 from a 4-chassis system to an 8-chassis system.

As discussed above, system 10 is powered by a parallel array of AC to DC power supply modules 14. The power supply module 14 is sized such that system 10 will tolerate the failure of one power supply module with no degradation in system performance. As shown in FIG. 9, six AC to DC power supply modules 14 are connected at their outputs to a pair of parallel power busses 136. Only five of the six DC power supply modules 14 are necessary to supply power to the amplifier system. Power supply modules 14 receive AC input power from a three-phase input power source 140. It will be appreciated by those persons having skill in the art that other power supply configurations may be used, e.g., a single-phase AC input power source, or other multi-phase input AC power sources, provided that the output power of power supply modules 14 provides a DC voltage supply to the power rail 136. Power supply modules 14 may be sized to provide redundancy for the power supply, e.g., five power supply modules 14 are sufficient to carry the entire load of system 10 (or two, three or four power supply modules 14, depending on the amount of power redundancy that is desired.)

Each embedded controller 101 used in modular power amplifier system 10 includes firmware that permits an array made up of 4, 8, or 16 SSPA chassis to operate as a single chassis for purposes of normal amplifier system operation. Further, embedded controller 101 firmware design creates a hierarchy of control that allows any one of 4, 8, or 16 SSPA chassis to function as the system controller.

It should be understood that the application is not limited to the details or methodology set forth in the following description or illustrated in the figures. It should also be understood that the phraseology and terminology employed herein is for the purpose of description only and should not be regarded as limiting.

The construction and arrangement of the power amplifier system 10 and power amplifier chassis 20, as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. A modular power amplifier system comprising:
   at least one cabinet,
   a plurality of power amplifier modules removably mounted within the at least one cabinet, each of the power amplifier modules comprising an embedded controller and a power amplifier;
   RF distribution panel comprising an input port for receiving an RF input signal, and at least one signal splitter for dividing the RF input signal for input to the plurality of power amplifier modules;
   a plurality of coaxial dividers configured to divide the RF input signal substantially equally among the plurality of power amplifier modules; and
   a plurality of passive waveguide combiners configured to combine a plurality of amplified RF output signals from the plurality of power amplifier modules at an output port to provide an RF output signal;
   wherein one embedded controller is designated as a master controller, the master controller configured to monitor at least one operating parameter associated with each power amplifier module, and wherein the master controller is further configured to transfer master control to another embedded controller selected from one of the remaining embedded controllers in response to the embedded controller sensing that the at least one monitored operating parameters indicates a failure of the master controller; and
   wherein a combined power rating of the plurality of power amplifier modules exceeds a rated power of the system by at least one power amplifier module.

2. The modular power amplifier system of claim 1, wherein modular power amplifier system power is combined passively, and wherein no switching element is used between the input port and the output port thereby eliminating interruption of the RF output power signal due to a failure of a switching element.

3. The modular power amplifier system of claim 1, wherein the modular power amplifier system comprises four power amplifier modules.

4. The modular power amplifier system of claim 1, wherein the modular power amplifier system comprises any number of power amplifier modules between two and eight.

5. The modular power amplifier system of claim 1, wherein the system comprises two cabinets coupled through the waveguide combiner.

6. The modular power amplifier system of claim 5, wherein the capacity of the modular power amplifier system is extendible incrementally from nine to sixteen power amplifier modules.

7. The modular power amplifier system of claim 1, wherein the at least one cabinet further comprises a power rail assembly extending vertically within the at least one cabinet, the power rail assembly comprising longitudinal slots for receiving a pair of terminals of a pair of power cables into electrical contact with a pair of internal power conductors.

8. The modular power amplifier system of claim 3, wherein the plurality of coaxial dividers comprises a 4-way RF input port, the 4-way RF input port comprising:
   a first coaxial divider for dividing the RF input signal into two input signal path, and a second and third coaxial divider, the second and third coaxial dividers configured to receive the one of the two input signal paths and to further split the four input signal paths, the four input signal paths being applied to an input of each of the four power amplifier modules.

9. The modular power amplifier system of claim 8, wherein the plurality of passive waveguide combiners comprises three waveguide combiners, the first and second waveguide combiners each configured to receive an output signal from each of the power amplifier modules and combine the power amplifier modules output signals into a first combined output signal and a second combined output signal, and a third waveguide combiner configured to receive a first combined output signal and a second combined output signal, and to combine a first combined output signal and a second combined output signal into a third combined RF output signal at an output port.

10. The modular power amplifier system of claim 1, wherein the modular power amplifier system comprises eight power amplifier modules mounted in the cabinet.

11. The modular power amplifier system of claim 10, wherein the modular power amplifier system comprises a pair of 4-way RF input ports, wherein each 4-way RF input port comprises:
   a first coaxial divider for dividing the RF input signal into two input signal path;
   a second and a third coaxial divider configured to receive the one of the two input signal paths and to further split the four input signal paths, the four input signal paths being applied to an input of each of an associated set of four power amplifier modules; and
   a link for interconnecting the second and third coaxial dividers.

12. The modular power amplifier system of claim 1, wherein the modular power amplifier system comprises two cabinets, wherein each cabinet is configured to contain up to eight power amplifier modules, and the modular power amplifier system further comprising an additional waveguide combiner for coupling the two cabinets to generate the RF output signal.

13. The modular power amplifier system of claim 1, wherein, each power amplifier module of the plurality of power amplifier modules further comprises a solid state power amplifier having a signal path input port, a power input port, and a signal output port.

14. The modular power amplifier system of claim 13, wherein the system uses a root-mean-square (RMS) sampling port configured to measure combined RMS power of all of the solid state power amplifier chassis.

15. The modular power amplifier system of claim 13, further comprising an isolator connected between one solid state power amplifier and an associated waveguide coupler.

16. The modular power amplifier system of claim 15, each waveguide coupler connected with the waveguide combiner to connect a pair of the solid state power amplifiers in communication with a first level dual port waveguide combiner, and one output port of the first dual port waveguide combiner is connected in communication with a second level dual port waveguide combiner, the second level dual port waveguide combiner connected in communication with a third level dual port waveguide combiner.

17. The modular power amplifier system of claim 16, wherein the third level dual port waveguide combiner provides an overall system combined output to an RF output port.

18. The modular power amplifier system of claim 17, wherein a directional waveguide coupler is connected between the output of the third level combiner and RF output port.

19. The modular power amplifier system of claim 18, wherein the directional waveguide coupler is configured to provide reverse power and forward power samples to an RMS power measurement module, and to split the forwarded power samples before input to RMS power measurement module to provide an RF external output sampling port.

20. The modular power amplifier system of claim 19, wherein RMS power measurement module 120 is configured to provide information regarding load balancing and indicates to an embedded microprocessor of the master controller when a solid state power amplifier chassis has failed or is about to fail.

21. The modular power amplifier system of claim 20, wherein the embedded controller further comprises firmware, the firmware configured to permits the array of 4, 8, or 16 solid state power amplifier chassis to operate as a single chassis for purposes of normal amplifier operation.

22. The modular power amplifier system of claim 21, wherein the firmware is configured to create a hierarchy of control that allows any one of the 4, 8, or 16 SSPA chassis to function as the system controller.

* * * * *